(12) United States Patent
Keller et al.

(10) Patent No.: US 6,618,840 B2
(45) Date of Patent: Sep. 9, 2003

(54) METHOD AND SYSTEM FOR ANALYZING A VLSI CIRCUIT DESIGN

(75) Inventors: S Brandon Keller, Fort Collins, CO (US); Gregory Dennis Rogers, Fort Collins, CO (US); Charles A Lelm, Windsor, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 09/782,001

(22) Filed: Feb. 12, 2001

(65) Prior Publication Data

US 2002/0112214 A1 Aug. 15, 2002

(51) Int. Cl.[7] .............................................. G06F 17/50
(52) U.S. Cl. ............................................... 716/4; 716/1
(58) Field of Search ....................................... 716/1–14

(56) References Cited

U.S. PATENT DOCUMENTS

| | | | | |
|---|---|---|---|---|
| 5,065,355 A | * | 11/1991 | Hayase | 716/14 |
| 5,508,937 A | * | 4/1996 | Abato et al. | 716/6 |
| 5,987,240 A | | 11/1999 | Kay | 716/5 |
| 6,055,366 A | | 4/2000 | Le et al. | 716/5 |
| 6,078,737 A | * | 6/2000 | Suzuki | 716/19 |
| 6,397,373 B1 | * | 5/2002 | Tseng et al. | 716/5 |
| 2002/0083398 A1 | * | 6/2002 | Takeyama et al. | 716/1 |

OTHER PUBLICATIONS

Ju, Yun–Cheng and Saleh, Resve A., "Incremental Techniques for the Identification of Statically Sensitizable Critical Paths", p.p. 1–8; http://www.sigda.org/Archives/ProceedingArchives/Dac/Dac91/papers/1991/dac91/3...downloaded Oct. 16, 2002.

International Search Report dated Oct. 17, 2002 in connection with corresponding GB application No. 0201811.7.

* cited by examiner

*Primary Examiner*—Vuthe Siek
*Assistant Examiner*—Sun James Lin

(57) ABSTRACT

A method is disclosed for analyzing a VLSI circuit design stored in a computer system. Each segment of the design layout is stored in the computer memory for analysis and implementation. An electronic computer-aided design (E-CAD) program is used to analyze the design. First, the E-CAD tool is run on the entire design or on a designated part thereof. The tool compares the design to specifications and returns a list of violations on a segment basis. The E-CAD tool identifies violations for the designer to fix through redesign or clarification of specifications. The method marks or flags signals of those segments reporting violations. After the designer has attempted to remedy the violations, the method reruns the E-CAD analysis on those signals that reported a violation during a prior run.

16 Claims, 6 Drawing Sheets

METHOD AND SYSTEM FOR ANALYZING A VLSI CIRCUIT DESIGN

FIELD OF INVENTION

The present invention relates generally to integrated circuit design. More particularly, it relates to a software method for running an analysis tool to identify design violations.

BACKGROUND

In the field of integrated circuit (IC) design and particularly very large scale integration (VLSI) design, it is desirable to test the design before implementation and to identify potential violations in the design. Before implementation on a chip, the design may be stored in a computer memory. The computer system may store information about specific signals and devices, such as transistors, that are part of the design. This information may include the connections between devices and the types of conducting segments that link devices.

Based on the connection and device information, the designer may perform tests on the design to identify potential problems. For example, one portion of the design that might be tested is the conducting material on the chip. Representations of individual metal segments may be analyzed to determine whether they meet certain specifications, such as electro-migration and self-heating specifications. Other examples of testing include electrical rules checking tests, such as tests for noise immunity and maximum driven capacitance, and power analysis tests that estimate power driven by a particular signal and identify those over a given current draw. These tests may be performed using software tools such as electronic computer-aided design (E-CAD) tools.

Existing methods apply the E-CAD test tool to each segment in the design, which can be a time-intensive process. The tool identifies violations of specifications and alerts the user of particular problems. The user then attempts to solve the problems through re-design, or may change the specifications for particular violations. For example, the E-CAD tool may perform its initial analysis assuming a worst-case scenario. In some types of analyses, the worst-case scenario may mean the maximum load on a particular segment. If the analysis is of the current through a particular segment, then the tool may assume that all connected devices are driving that segment simultaneously. In fact, this situation might be impossible if, for example, the design does not allow all of the devices to drive the segment at the same time. In this case, the designer may clear the violation by using the E-CAD tool to adjust the design specifications on a segment-by-segment basis.

Once the first analysis is completed and the designer has attempted to resolve all violations, the E-CAD tool must be run again to determine whether the adjustments resolved all violations, or whether further re-design or analysis is required. Existing methods perform subsequent analyses by re-running the tool on all signals in the entire circuit or a blocked portion thereof. As explained, this is a time-intensive process because the design may contain millions or more signals and segments to be analyzed. What is needed is a more efficient method of analyzing a design.

SUMMARY OF INVENTION

A method is disclosed for analyzing a VLSI circuit design stored in a computer system. Each segment of the design layout is stored in the computer memory for analysis and implementation. An electronic computer-aided design (E-CAD) program is used to analyze the design. First, the E-CAD tool is run on the entire design or on a designated part thereof. The tool compares the design to specifications and returns a list of violations on a segment basis. The tool may analyze, for example, current through each segment under worst-case scenarios to ensure that the design meets specification. The E-CAD tool identifies violations for the designer to fix through redesign or clarification of specifications. The method marks or flags signals of those segments reporting violations. After the designer has attempted to remedy the violations, the method reruns the E-CAD analysis on those signals that reported a violation during a prior run.

DETAILED DESCRIPTION

Figure 1:
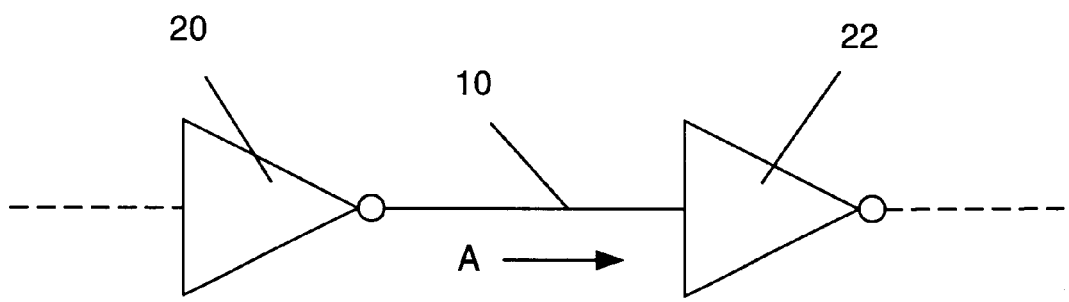
FIG. 1 shows a schematic representation of a connection between two devices in a circuit design.
Figure 2A:
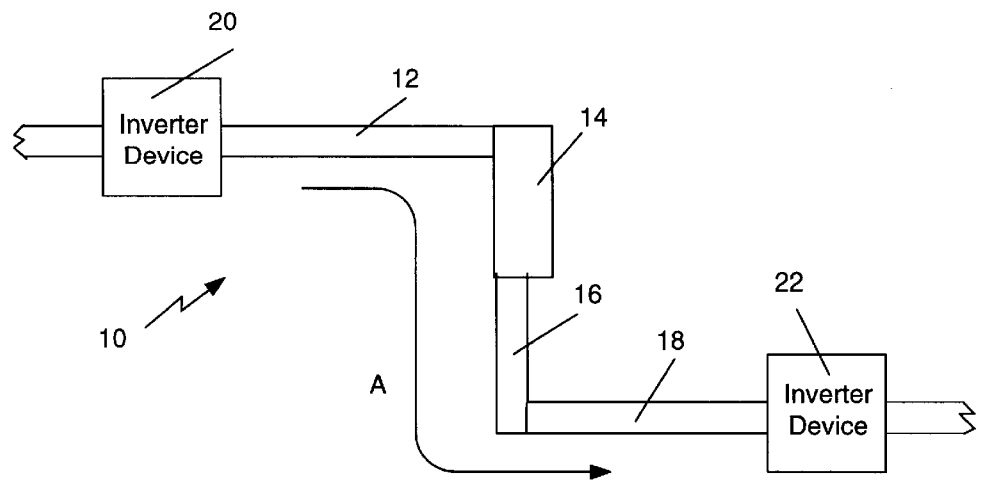
FIGS. 2A–2B show two possible physical layouts of the schematic connection shown in FIG. 1.

FIG. 1 shows a schematic diagram of a connection 10 in a VLSI design. The connection 10 is shown as being that conducting portion between, for example, two inverter devices 20, 22. The connection 10 is part of a much larger design comprising millions or more connections, and devices or components. The connection 10 may be any conductor in the design between devices. The connection carries a signal A that is tracked in the computer design, along with the devices and nodes in the design. Every connection 10 in the design may carry a different signal tracked in the design model. FIG. 2A shows a physical layout of the connection 10 having signal A. This is the metal or other conducting material that connects the inverter devices 20, 22. As shown in FIG. 2A, a connector may have many segments 12, 14, 16, 18, all of which carry the same signal A. As used herein, a "segment" 12, 14, 16, or 18 means any conducting medium that carries a signal in an IC chip. Segments are defined as part of the layout of the circuit model stored in the computer data file (also referred to as the RC netlist) and analyzed by the E-CAD tool. Analysis of each part of the connection 10 may be important, so the computer design may break the connection 10 into multiple segments 12, 14, 16, 18 each time the connection 10 changes direction or dimensions. For example, a connection 10 may comprise segments 12, 14, 16, 18 having different physical dimensions. Because the properties of the conductor may vary with the physical dimensions of a segment, the designer may want to analyze each segment separately.

Figure 2B:
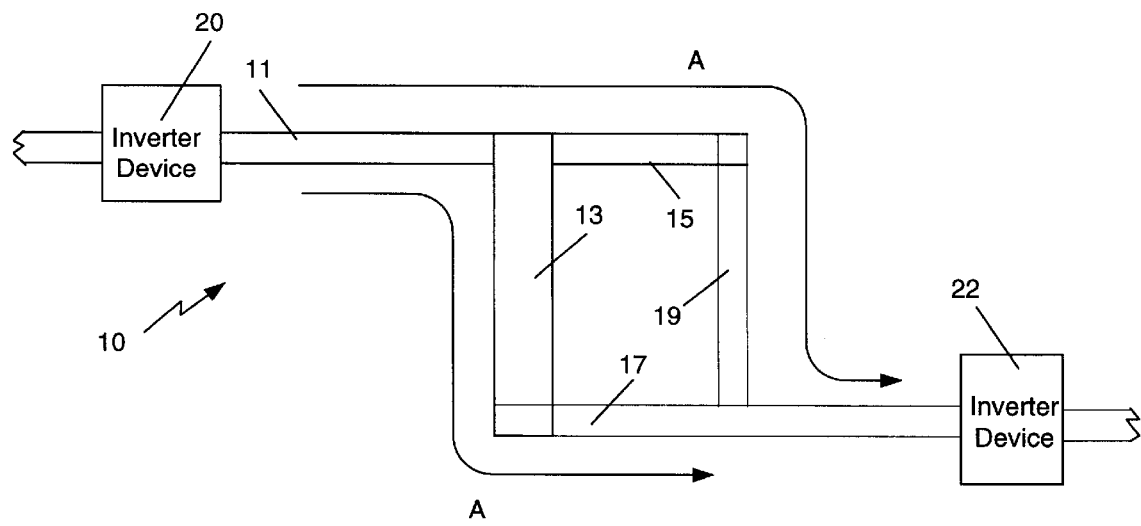

FIG. 2B shows an alternative layout of the connector 10, having segments 11, 13, 15, 17, 19 that carry the signal A between two inverter devices 20, 22. Although the segments 11, 13, 15, 17, 19 form different paths, they are still referred to herein as a single connection 10 and the signal A uses both paths. In the example of FIG. 2B, the current may be different in the paths through segment 13 versus segments 15 and 19. If the E-CAD tool is performing a current analysis, a violation might appear for some segments in the connector 10 but not appear in others. One skilled in the art will recognize that a connection 10 may have multiple possible layout designs, having different numbers of segments 12, 14, 16, 18 and paths.

Figure 3:
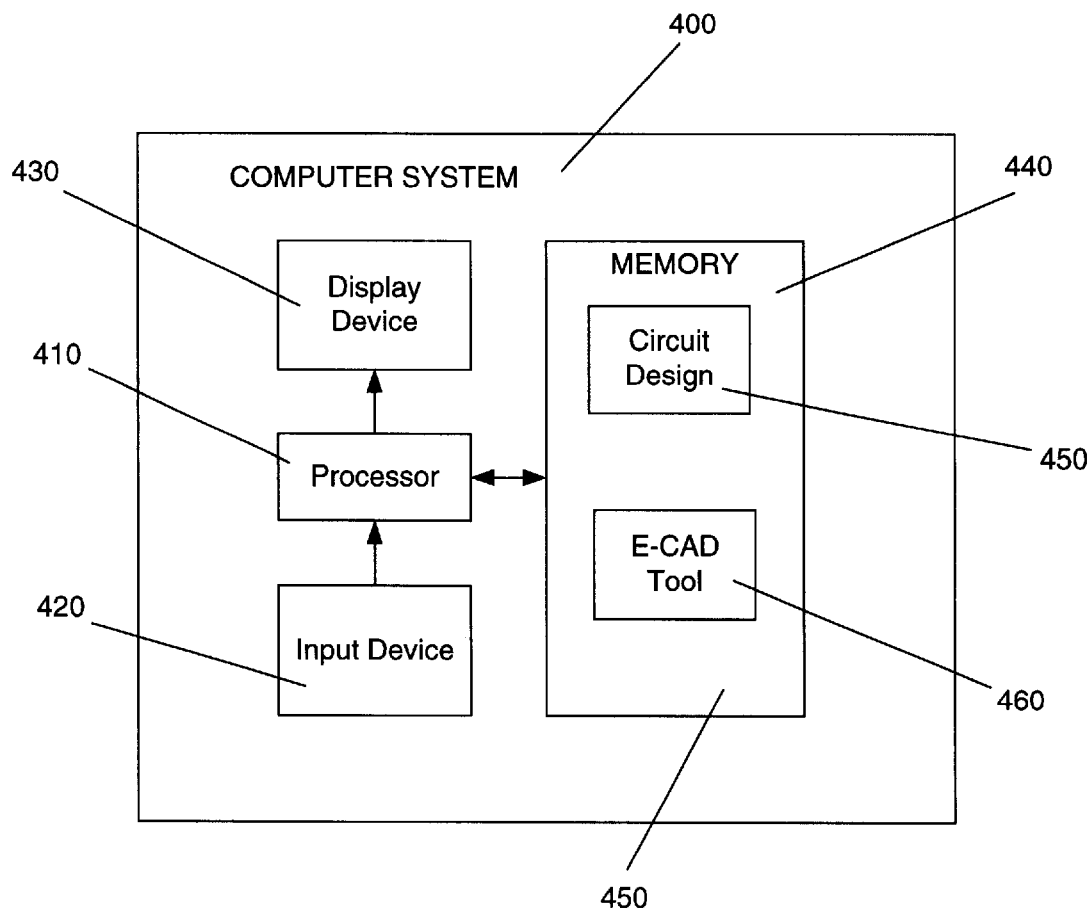
FIG. 3 shows a block diagram of a computer system that performs the method.

FIG. 3 shows a block diagram of a computer system 400 having a processor 410 connected to an input device 420 and a display device 430. The processor 410 accesses memory 440 in the computer system 400 that stores a VLSI circuit design 450. The design 450 stored in memory 440 includes nodal connection information and information about the physical layout of the segments 12, 14, 16, 18. An E-CAD tool 460 is also stored in the memory 440 for analyzing the circuit model 450. In use, the input device 420 receives commands instructing the processor 410 to call the E-CAD tool software 460 to perform a circuit analysis on the model 450. The results of the analysis may be displayed on the display device 430. Lists of violations may be output to the display device 430.

Figure 4:
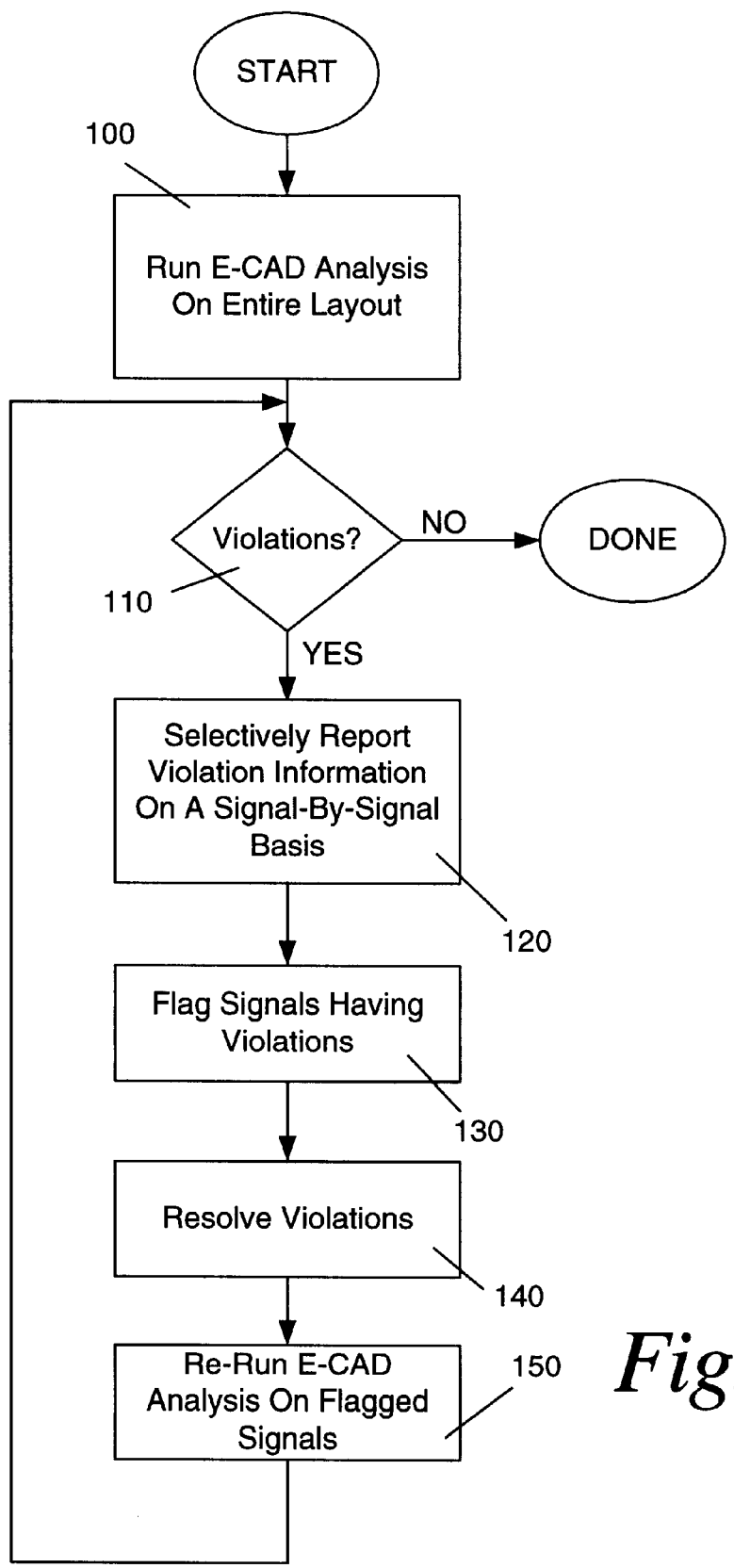
FIG. 4 shows a flow chart of the method.

FIG. 4 shows a flow chart of the method for analyzing VLSI designs. The method may be implemented in, for example, an E-CAD tool 460 stored in memory 440 for execution by a processor 440. The E-CAD analysis tool 460 is run 100 on signals in the entire chip design 450, or on a designated portion of the chip design 450 selected by the user or the computer system 400. The method determines 110 whether there are any specification violations in the design 450 and may output to information about those violations to the display device 430. The computer system 400 of the E-CAD tool 460 reads the circuit model 450 stored in memory 440, which model 450 maintains information about each layout segment 12, 14, 16, 18 in the design. Violations are reported 120 on a segment-by-segment, or signal-by-signal, basis. Violations may be stored to a violations file in the memory 440, the contents of which may be output to the display device 430, or to a peripheral device, such as a printer (not shown) connected to the computer system 400.

Signals having violations are flagged or marked 130 by the tool 460. The designer then attempts to resolve 140 the reported violations by redesigning the layout or by reconfiguring the E-CAD tool 460. For example, if the user concludes that the purported worst-case scenario used by the tool 460 in the prior run cannot actually occur in the circuit 450, then the designer may reconfigure the tool 460 to with that information to clear the violation. For example, in the connection 10 shown in FIGS. 1, 2A and 2B, if any of the segments 12, 14, 16, 18 reports a violation, then the signal A is flagged for reference by the tool 460. The E-CAD tool 460 is then re-run 150 on the specific signals reporting violations during a prior analysis. If signal A was flagged 130 during a prior analysis, then the method would include signal A among a limited group of signals to be analyzed a second time. Specific signals designated as having shown violations in a previous run are input to the E-CAD tool 460 for subsequent analysis. The method is more efficient than existing methods because it does not re-run the analysis on the entire design 450, but focuses on previously-identified violations using the signals of those violations as reference markers.

Figure 5:
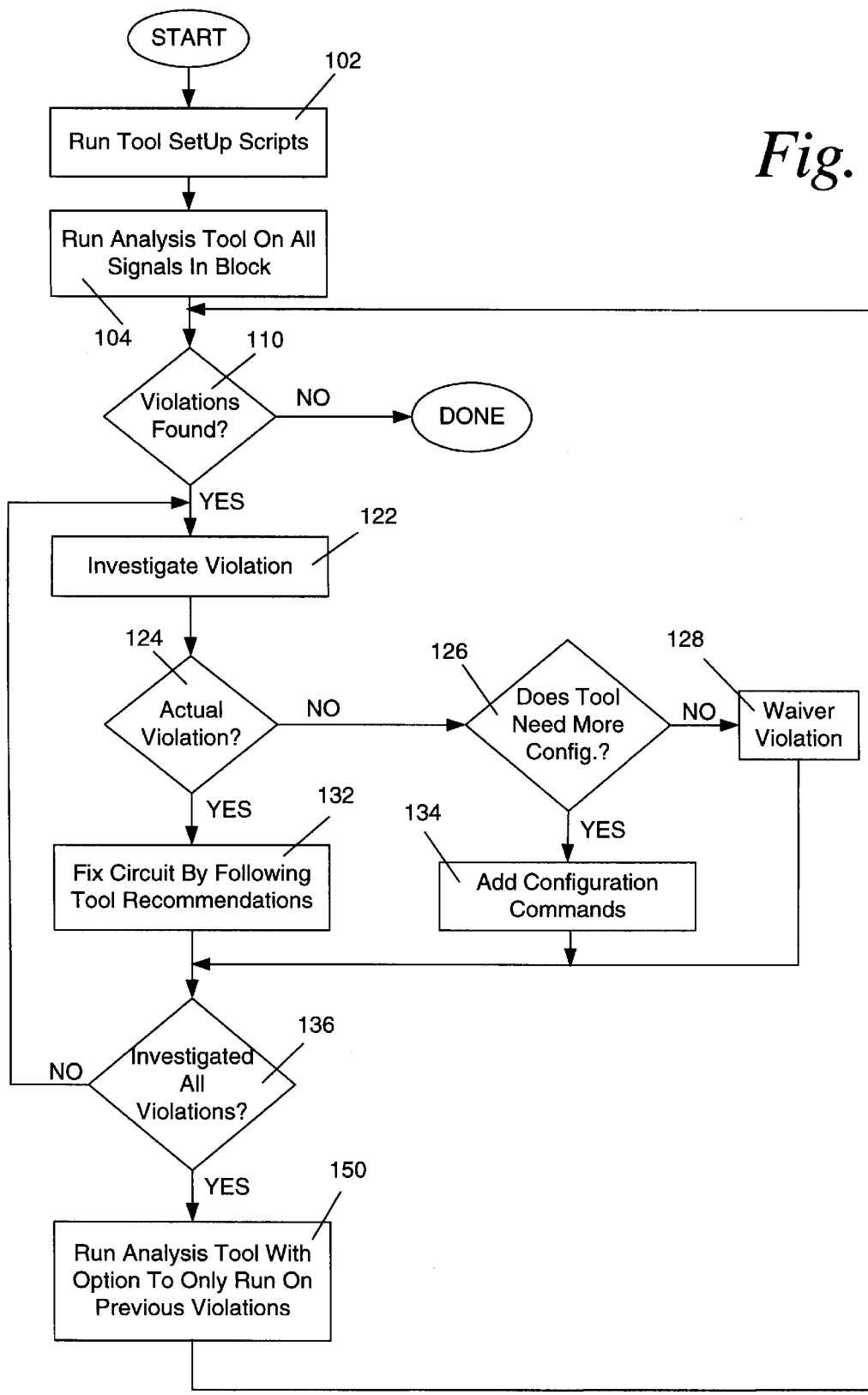
FIG. 5 shows a more detailed flow chart of the method shown in FIG. 4.

FIG. 5 shows a flow chart of the method used by a designer to identify and analyze violations. The user runs 102 set-up scripts for the E-CAD tool 460 to specify the type of analysis to be performed, and then performs the analysis 104 on all signals in the circuit 450 or a particular block of the circuit 450. The tool 460 determines 110 whether any violations exist, and outputs to the display device 430 the names of any signals or segments reporting violations. The violations are then investigated 122 to determine their nature. If a violation is an actual violation 124, then the circuit design 450 is fixed 132 using recommendations from the E-CAD tool 460. If the reported violation is not an actual violation 124, then the method determines 126 whether the tool 460 needs further configuration. If further configuration is required, then the designer adds 134 configuration commands to the tool 460. For example, if only some but not all sources can actually drive a particular segment 12, 14, 16, 18 at a given moment, then the tool 460 may be configured to recognize that the maximum current through the segment 12, 14, 16, 18 is limited to some value lower than the value used during the prior run that indicated the violation. Alternatively, the user may conclude that the tool 460 does not require further configuration and that the violation may simply be waived 128. The process of investigating and attempting to resolve violations continues until all violations have been investigated 136. When all violations have been investigated 136, the analysis tool 460 is run again 150 as configured to analyze only those signals that reported violations during a prior run.

Figure 6:
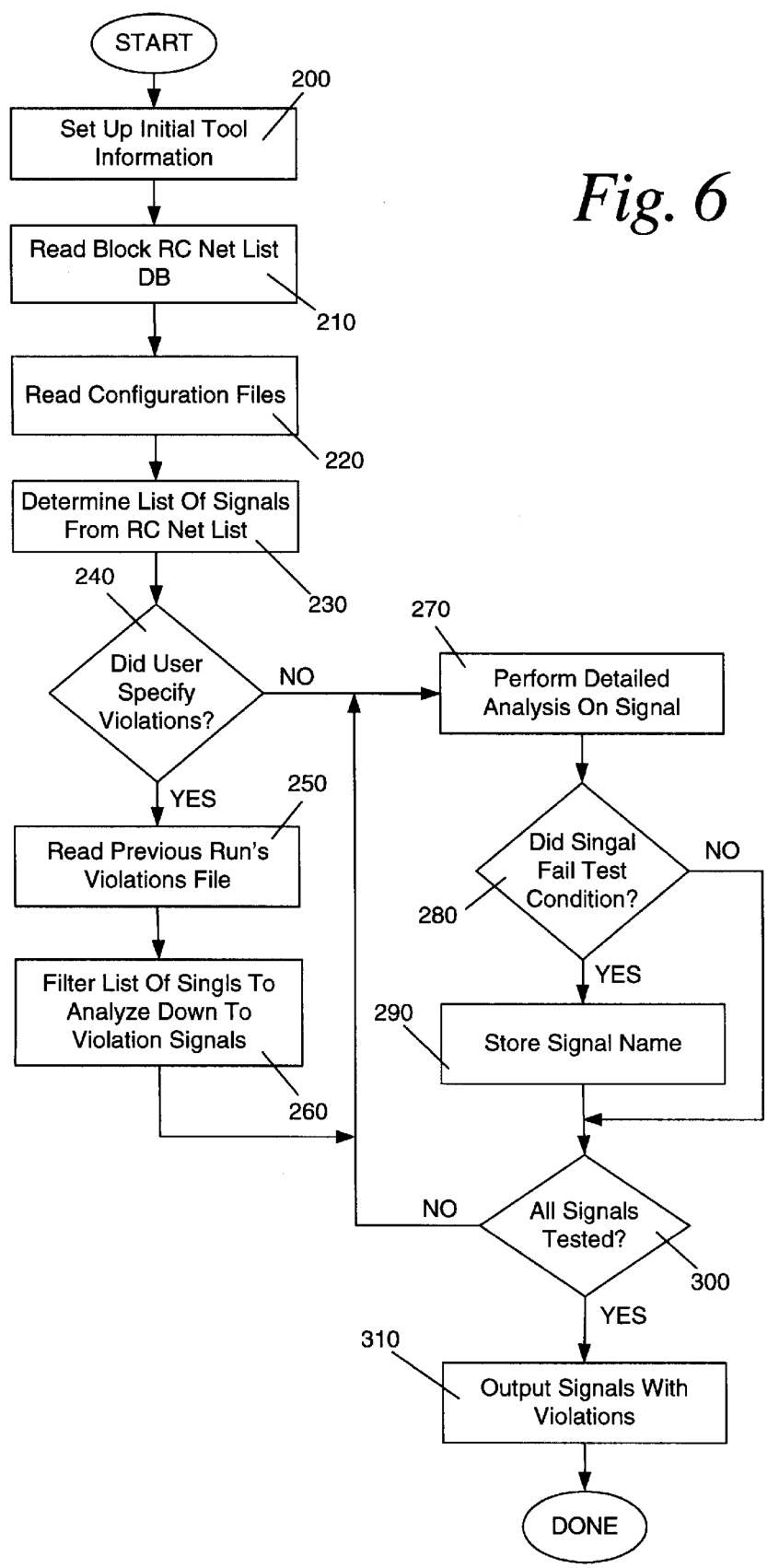
FIG. 6 shows a more detailed flow chart of the method shown in FIG. 4.

FIG. 6 shows a flow chart of the method of the internal operation of the E-CAD tool 460. The tool 460 receives the initial set-up information 200. The tool 460 then begins analysis of the design 450 on a signal-by-signal basis by reading 210 a computer data file 450, or RC netlist 450, having information about the layout and connections of the design segments 12, 14, 16, 18. The tool 460 reads 220 the configuration files and identifies 230 a list of signals based on the RC netlist 450. The tool determines 240 whether the user specified certain violations. If the user did specify violations, then the tool 460 reads 250 the violations file created during a prior run of the tool 460. The violations file is filtered 260 to identify the signals having segments that reported violations.

The tool 460 then performs 270 a detailed analysis of the signals identified, as it does in its usual operation. If the user did not specify violations 240, then the tool 460 goes directly to this analysis step 270. In the analysis the tool 460 analyzes 270 each signal individually to determine 280 whether a signal fails a condition set forth in the initial tool set-up information. If a signal reports a violation, then the signal name is stored 290 to a violations file. The analysis continues until all signals have been tested 300. When all signals have been tested, the tool outputs 310 a list of violations to the display device 430. The user then attempts to resolve these violations by identifying the particular segments in each signal that cause the violation, as described in FIG. 5.

Although the present invention has been described with respect to particular embodiments thereof, variations are possible. The present invention may be embodied in specific forms without departing from the essential spirit or attributes thereof. Although reference is made to particular types of circuit design tests, such as tests for self-heating and electromigration, one skilled in the art will recognize that the method may apply to any analysis tool that operates on a large group of signals and identifies problem signals or segments by differentiating failing signals or segments from acceptable signals or segments. In addition, although aspects of an implementation consistent with the present invention are described as being stored in memory, one skilled in the art will appreciate that these aspects can also be stored on or read from other types of computer program products or computer-readable media, such as secondary storage devices, including hard disks, floppy disks, or CD-ROM; a carrier wave from the Internet or other network; or other forms of RAM or read-only memory (ROM). It is desired that the embodiments described herein be considered in all respects illustrative and not restrictive and that reference be made to the appended claims and their equivalents for determining the scope of the invention.

We claim:

1. A method for analyzing a circuit design comprising:

performing a first analysis of a specification for the circuit design using an electronic computer-aided design (E-CAD) tool;

identifying violations of the specification;

attempting to resolve the violations by investigating the violations, and reconfiguring the E-CAD tool based on the investigating;

marking signals having the violations; and performing a second analysis of the circuit design based upon the marked signals, wherein the step of performing the second analysis comprises rerunning the first analysis only on the marked signals after the reconfiguring of the E-CAD tool.

2. The method of claim 1, further including performing the first and second analyses on a VLSI circuit design stored in a memory.

3. The method of claim 1, further including storing the circuit design in a computer memory.

4. The method of claim 3, further including storing each layout segment and each signal of the circuit design in the computer memory.

5. The method of claim 1, wherein the step of performing the first analysis includes performing the first analysis on all of the design.

6. The method of claim 1, wherein the step of performing the first analysis includes performing the first analysis on a designated portion of the design.

7. The method of claim 1, wherein the identifying step includes identifying layout segments having violations.

8. The method of claim 1, further comprising outputting segments and signals reporting the violations.

9. The method of claim 1, wherein the step of marking comprises creating a violations file that stores names of signals reporting violations.

10. A computer system for analyzing signals in a circuit design stored in a memory, the system comprising:

a storage medium; and a processor for executing a software program stored on the storage medium for analyzing a circuit design, the software program comprising a set of instructions for:

performing an analysis of the circuit design using an electronic computer-aided design (E-CAD) tool;

identifying signals having violations of specifications for the circuit design;

storing names of signals having violations to a violations file;

reconfiguring the E-CAD tool after performing the analysis, based on the violations; and rerunning the analysis only on the signals having violations, after the reconfiguring.

11. The system of claim 10, wherein the steps of performing the analysis include performing the analysis on a VLSI circuit design.

12. The system of claim 10, wherein the step of performing the analysis includes performing the analysis on all signals of the design, and wherein the step of rerunning the analysis comprises rerunning the analysis on a portion of the design including the signals having the violations.

13. A computer-readable medium having computer-executable instructions for performing a method for analyzing a computer representation of a circuit design having a plurality of layout segments with signals transmitted on said segments, the method comprising:

performing a first analysis of a circuit design using an electronic computer-aided design (E-CAD) tool;

identifying segments in the design that violate specifications;

identifying signals on the segments having violations;

determining whether each violation is an actual violation;

if the violatiion is an actual violation, fixing the violation;

if the violation is not an actual violation, reconfiguring the specifications; and performing a second analysis of the circuit design based upon the signals having violations, wherein the step of performing the second analysis comprises rerunning the first analysis only on the signals having violations, after the reconfiguring.

14. The medium of claim 13, wherein the method further comprises storing names of the signals having violations to a violations file.

15. The medium of claim 13, wherein the steps of performing the first and second analyses include performing the first and second analyses on a VLSI circuit design.

16. The medium of claim 13, wherein the step of performing the first analysis includes performing the first analysis on all signals of the design.

* * * * *